(12) United States Patent
Miyata et al.

(10) Patent No.: US 8,779,507 B2
(45) Date of Patent: Jul. 15, 2014

(54) INSULATED GATE SEMICONDUCTOR DEVICE

(75) Inventors: Takuji Miyata, Ora-gun (JP); Kazumasa Takenaka, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/435,833

(22) Filed: Mar. 30, 2012

(65) Prior Publication Data

US 2012/0248531 A1 Oct. 4, 2012

(30) Foreign Application Priority Data

Mar. 31, 2011 (JP) ................. 2011-079182

(51) Int. Cl.
| H01L 29/66 | (2006.01) |
| H01L 29/41 | (2006.01) |
| H01L 29/423 | (2006.01) |
| H01L 29/739 | (2006.01) |

(52) U.S. Cl.
CPC ........ *H01L 29/7397* (2013.01); *H01L 29/4236* (2013.01); *H01L 29/4238* (2013.01)
USPC .... 257/331; 257/330; 257/332; 257/E29.136; 257/E29.201

(58) Field of Classification Search
USPC .................. 257/330, 331, 333, 334, E29.052, 257/E29.121, E29.131, E29.136, E29.201, 257/E29.257, 332; 438/270, 271, 272, 589
See application file for complete search history.

(56) References Cited

U.S. PATENT DOCUMENTS

| 5,072,266 | A | * | 12/1991 | Bulucea et al. | 257/330 |
| 5,298,780 | A | * | 3/1994 | Harada | 257/330 |
| 5,405,794 | A | * | 4/1995 | Kim | 438/270 |
| 5,410,170 | A | * | 4/1995 | Bulucea et al. | 257/332 |
| 5,674,766 | A | * | 10/1997 | Darwish et al. | 438/270 |
| 5,783,491 | A | * | 7/1998 | Nakamura et al. | 438/702 |
| 5,814,858 | A | * | 9/1998 | Williams | 257/328 |
| 5,866,931 | A | * | 2/1999 | Bulucea et al. | 257/331 |
| 6,060,747 | A | * | 5/2000 | Okumura et al. | 257/331 |
| 6,239,463 | B1 | * | 5/2001 | Williams et al. | 257/328 |
| 6,359,306 | B1 | * | 3/2002 | Ninomiya | 257/328 |
| 6,518,621 | B1 | * | 2/2003 | Hshieh et al. | 257/328 |
| 6,586,833 | B2 | * | 7/2003 | Baliga | 257/712 |
| 6,653,691 | B2 | * | 11/2003 | Baliga | 257/390 |
| 6,713,351 | B2 | * | 3/2004 | Blanchard | 438/270 |

(Continued)

FOREIGN PATENT DOCUMENTS

| JP | 2009-224458 | 10/2009 |
| JP | 2010-238796 | 10/2010 |

*Primary Examiner* — Fernando L Toledo
*Assistant Examiner* — Christine C Lau
(74) *Attorney, Agent, or Firm* — Patents on Demand, P.A.; Scott M. Garrett; Brian K. Buchheit

(57) ABSTRACT

A gate lead wiring and an electrical conductor connecting the gate lead wiring to a protective diode are arranged in a straight line without bending along one and the same side of the chip. A first gate electrode layer extending on the gate lead wiring and the electrical conductor, which connects them to the protective diode, has one bent portion or no bent portion. Further, the protective diode is arranged adjacent to the electrical conductor or the gate lead wiring, and a portion of the protective diode is arranged in close proximity to a gate pad portion.

20 Claims, 4 Drawing Sheets

(56) References Cited

U.S. PATENT DOCUMENTS

| | | | |
|---|---|---|---|
| 7,067,874 B2* | 6/2006 | Nakamura et al. | 257/330 |
| 7,663,186 B2* | 2/2010 | Ono et al. | 257/341 |
| 8,232,610 B2* | 7/2012 | Nakazawa et al. | 257/401 |
| 2002/0195657 A1* | 12/2002 | Williams et al. | 257/332 |
| 2003/0227052 A1* | 12/2003 | Ono et al. | 257/341 |
| 2005/0286194 A1* | 12/2005 | Fujiki et al. | 361/100 |
| 2010/0327359 A1* | 12/2010 | Nakazawa et al. | 257/355 |
| 2013/0309823 A1* | 11/2013 | Su et al. | 438/237 |

* cited by examiner

US 8,779,507 B2

INSULATED GATE SEMICONDUCTOR DEVICE

This application claims priority from Japanese Patent Application Number JP2011-079182 filed on Mar. 31, 2011, the content of which is incorporated herein by reference in its entirety.

BACKGROUND OF THE INVENTION

1. Field of the Invention

The present invention relates to an insulated gate semiconductor device, and more particularly to an insulated gate semiconductor device that contributes to a reduction in on-state resistance.

2. Description of the Related Art

An insulated gate semiconductor device having a trench structure is known which includes trenches in a grid pattern as seen in plan view. This technology is described for instance in Japanese Patent Application Publication No. 2010-238796.

Also, a reduction in on-state resistance is an important issue for the insulated gate semiconductor device having the trench structure, and one approach therefor is that cells are becoming increasingly finer. As an example of finer cells, known is a structure in which an interlayer dielectric that provides insulation between a gate electrode buried in a trench and a source electrode provided on a substrate surface is buried in the trench, so that the substrate surface is flattened. In this structure, the trenches are formed in stripes in the substrate as seen in plan view, and a source region is arranged to cross the trenches. This technology is described for instance in Japanese Patent Application Publication No. 2009-224458.

A configuration in which the trenches provided in the substrate and the gate electrodes buried in the trenches (hereinafter called generically trench gates) are in the form of stripes and an n type semiconductor region (i.e. a source region) and a p type semiconductor region (i.e. a base region or a body region) are arranged to cross the trench gates at right angles, as disclosed in Japanese Patent Application Publication No. 2009-224458, enables reducing a distance between the trench gates as compared to a configuration in which the trench gates are formed in the grid pattern as disclosed in Japanese Patent Application Publication No. 2010-238796, or specifically enables reducing a pitch of the trench gates to ⅓ of that of the trench gates in the grid pattern.

Also, the pattern of Japanese Patent Application Publication No. 2009-224458 enables reducing the distance between the trench gates and hence reducing the on-state resistance, as compared to a configuration in which the trench gates are in the form of stripes and the n type semiconductor region and the p type semiconductor region are arranged next to each other in parallel to adjacent trench gates between the adjacent trench gates.

However, it is known that, in the structure of the trench gates in the form of stripes as described above, voids occur in polycrystalline silicon filled into the trenches, and the occurrence of the voids can possibly cause characteristic variations (e.g. on-state resistance variations, threshold voltage (Vp) variations, and forward voltage (Vf) variations) or the like.

Also, there are demands for the reduction in the on-state resistance for further improvements in the characteristics.

SUMMARY OF THE INVENTION

The invention provides an insulated gate semiconductor device that includes a first semiconductor layer of a first general conductivity type, a channel layer of a second general conductivity type disposed on the first semiconductor layer, and a plurality of first trenches extending in a first direction in plan view of the semiconductor device. The first trenches penetrate through the channel layer and reach the first semiconductor layer. The device also includes a plurality of second trenches extending in a second direction in the plan view, and each of the second trenches connects a corresponding pair of first trenches in plan view. The device further includes a first insulating film provided on inner walls of the first trenches and the second trenches, a gate electrode disposed in the first trenches and the second trenches, a second insulating film covering the gate electrode, and a source region of the first general conductivity type formed in a surface portion of the channel layer. The source region extends in the second direction in the plan view.

DESCRIPTION OF THE PREFERRED EMBODIMENTS

Embodiments of the present invention will be described with reference to FIGS. 1 to 4C, giving a p-channel type MOSFET (metal oxide semiconductor field effect transistor) as an example.

Figure 1:
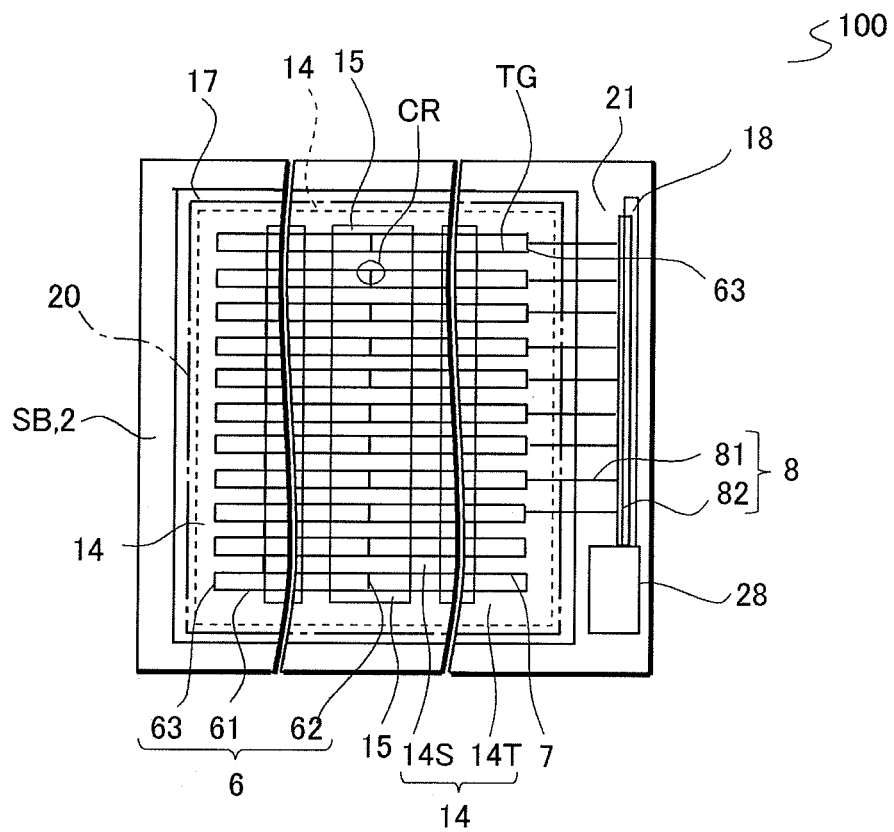
FIG. 1 is a plan view of assistance in explaining an insulated gate semiconductor device according to an embodiment of the present invention.

FIG. 1 is a schematic plan view showing a MOSFET 100 of the embodiment.

A substrate SB that forms a chip of the MOSFET 100 is constructed of a $p^-$ type semiconductor layer 2 stacked on top of a $p^+$ type silicon semiconductor substrate (not shown in FIG. 1). The $p^-$ type semiconductor layer 2 is, for example, a silicon semiconductor layer formed on the $p^+$ type silicon semiconductor substrate by epitaxial growth or the like, for example. An element region 20 (shown by chain lines in FIG. 1) is provided on a surface of the $p^-$ type semiconductor layer 2. Conductivity types such as $n^+$, n and $n^-$ belong in a general conductivity type, and conductivity types such as $p^+$, p and $p^-$ belong in the other general conductivity type.

The element region 20 is coated on its top surface with a source electrode 17 connected to a source region (not shown) of the MOSFET 100.

A trench 6 includes a first trench 61, a second trench 62 and a third trench 63. The plural first trenches 61 are provided parallel to each other in stripes extending in a first direction (or an X direction) as seen in plan view.

The second trench 62 crosses each of a pair of the adjacent first trenches 61 in T-shape in a crossing portion CR and extends in a second direction perpendicular to the X direction so as to provide a connection between the pair of the adjacent first trenches 61.

The third trench 63 extends in the second direction so as to provide a connection between termination portions of a pair of the adjacent first trenches 61.

A gate electrode 7 is buried in the trench 6 (or the first trench 61, the second trench 62 and the third trench 63). Hereinafter, the trench 6 and the gate electrode 7 buried in the trench 6 will sometimes be called generically a trench gate TG.

Plural source regions 15, which are impurity regions obtained by diffusing a p$^+$ type impurity into a surface of a channel layer, are provided in stripes extending in a Y direction.

A body region 14 is an impurity region obtained by diffusing an n$^+$ type impurity into a surface of an n type channel layer (not shown in FIG. 1) provided on the surface of the p$^-$ type semiconductor layer 2, and is adjacent to the source regions, surrounding outer sides of all the source regions. Also, the body region 14 is provided extending to the outside of the trenches 6 so as to surround all the trenches 6. The body region 14 is provided extending to the outside of the third trenches 63. The body region 14 has a ladder-shaped pattern formed of an outer frame portion 14T in the shape of a frame and a stripe portion 14S extending in the Y direction, as seen in plan view, and the source regions 15 and the body regions 14 are arranged alternating with each other, adjacent to each other along the Y direction. Incidentally, the element region 20 and the body region 14 are shown in FIG. 1 as being different in size for the sake of convenience; however, in the embodiment, the element region 20 does not extend beyond the formed region of the body region 14 (or the outer frame portion 14T).

Gate lead wiring 8 is arranged on a peripheral region 21 of the substrate SB outside the element region 20, and leads the gate electrode 7 out onto the surface of the p$^-$ type semiconductor layer 2 thereby to connect the gate electrode 7 to a gate pad portion 28.

The gate lead wiring 8 is constructed of a lead-out portion 81 and a linkage portion 82. The lead-out portion 81 is linked to the third trench 63 at one end (e.g. at the right-hand end as seen in FIG. 1), and is configured in the same manner as the gate electrode 7 of the element region 20 to lead the gate electrode 7 out of the element region 20. In other words, the lead-out portion 81 is formed by burying polycrystalline silicon doped with an impurity adjacent the first trench 61 provided in the substrate SB.

The linkage portion 82 is formed by subjecting a surface of the substrate SB to patterning of polycrystalline silicon so as to connect the plural lead-out portions 81 outside the element region 20. The linkage portion 82 extends for example in a straight rather than bent line along one side of the substrate SB (or the chip), as seen in plan view, and links the plural adjacent lead-out portions 81. Also, one end of the linkage portion 82 is connected to the gate pad portion 28 for example with a resistor (not shown) or a protective diode (not shown) provided below the gate pad portion 28.

Also, a gate metal layer 18 having a connection to the linkage portion 82 is provided on top of the linkage portion 82 of the gate lead wiring 8, and the gate metal layer 18 extends on the peripheral region 21 of the substrate SB so as to overlay the linkage portion 82 and connects to the gate pad portion 28. The gate electrode 7 is connected to the gate pad portion 28 via the gate lead wiring 8 and the gate metal layer 18. The gate metal layer 18 has one bent portion or no bent portion, and, here, as an example, the gate metal layer 18 is provided in a straight line along one side of the substrate SB (or the chip) without bending.

The provision of the linkage portion 82 of the gate lead wiring 8 in a straight line, such as is not bent, along one side of the semiconductor substrate enables avoiding formation of curved bent portions in corner portions of the chip.

For example when the linkage portion 82 extends to the corner portion of the chip and a bent portion is present, the element region 20 needs to be spaced a predetermined distance away from the bent portion. However, the absence of the bent portion eliminates restrictions on the spaced distance and hence enables expanding correspondingly the element region 20.

Incidentally, when the resistor having a connection to the linkage portion 82 is present, the resistor also is formed in a straight line without being bent.

Also, this enables minimizing the number of bent portions of the gate metal layer 18 superposed on and connected to the gate lead wiring 8. The gate metal layer 18 may be bent in order to connect to the gate pad portion 28, for example depending on arrangement of the gate pad portion 28; however, the gate metal layer 18 is not arranged in the corner portion of the chip. Minimization of the number of bent portions of the gate metal layer 18 enables expanding the element region 20.

In the embodiment, a configuration is such that all the first trenches 61 are connected together by the second trenches 62 or the third trenches 63, which will be described later. Therefore, a gate potential can be applied to all the gate electrodes 7 even in the presence of the third trenches 63 having no connections to the lead-out portions 81 in the vicinity of the gate pad portion 28, such as is shown for example in FIG. 1. Also, thus, although in FIG. 1 the gate lead wiring 8 and the gate metal layer 18 are provided substantially throughout the right side of the chip, the gate lead wiring 8 and the gate metal layer 18 may be provided extending a shorter length (for example, a length on the order of ½ of that of the side of the chip). As the gate lead wiring 8 and the gate metal layer 18 become smaller in their arranged area, the element region 20 can become correspondingly larger. Also, the lead-out portions 81 may be configured to connect to all the third trenches 63 at the right-hand end.

Figure 2A:
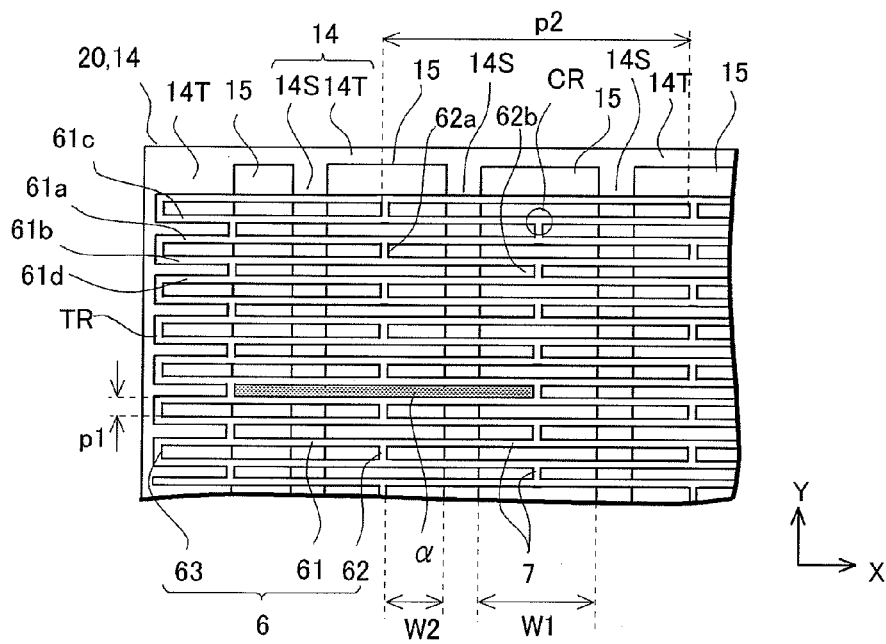
FIGS. 2A and 2B are plan views of assistance in explaining the insulated gate semiconductor device according to the embodiment of the present invention.
Figure 2B:
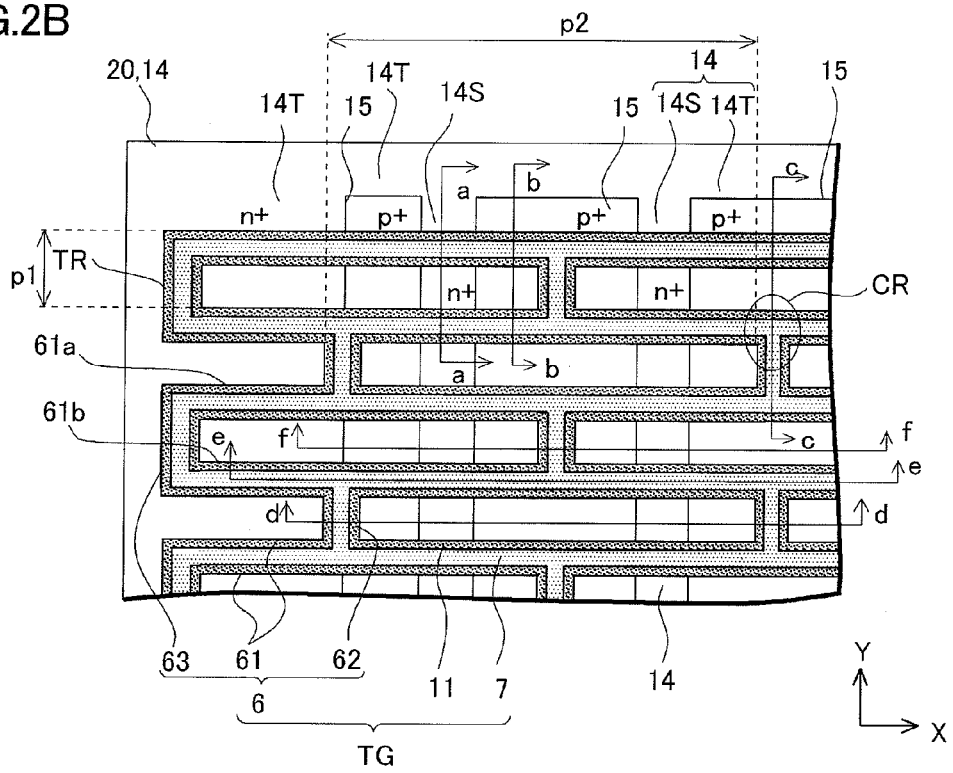

FIGS. 2A and 2B are a plan view of the element region 20 including termination portions TR of the trench gates TG, and an enlarged view of FIG. 2A, respectively. FIGS. 2A and 2B show an upper end portion and an upper left corner portion, respectively, of the element region 20 shown in FIG. 1. In other words, the trench gate TG arranged at the uppermost level in FIGS. 2A and 2B is the trench gate TG at the uppermost level of the element region 20.

Referring to FIG. 2A, the two adjacent first trenches 61 (61a, 61b) are arranged parallel to each other at spaced intervals (or at a pitch p1) of 0.54 µm, for example. In the element region 20, plural pairs of the first trenches 61 are arranged and are equally spaced apart at the pitch p1.

At least one second trench 62 is provided for each of the pairs of the first trenches 61. In the embodiment, description will be given by way of example with regard to an instance where the plural second trenches 62 are provided for each of the pairs of the first trenches 61. The second trenches 62 are spaced apart for example at equally spaced intervals (or at an equal pitch p2). Here, the pitch p2 of the second trenches 62 is larger than the pitch p1 of the first trenches 61.

The second trenches 62 cross the first trenches 61 in T-shape in the crossing portions CR, and thus, the second trenches 62 (62a) provided between a pair of the first trenches 61 (61a, 61b), and the second trenches 62 (62b) provided for first trenches 61c, 61d adjacent to the pair of the first trenches 61a, 61b, respectively, are arranged in such a relation that the second trenches 62a and 62b are shifted from each other by one-half the pitch p2.

The body region 14 is provided extending outwardly beyond ends of the source region 15 so as to surround the ends (e.g. upper and lower ends as seen in FIG. 2A) of the source region 15 extending in the Y direction. Also, the body region 14 is provided extending to the outside of the termination portions TR so as to surround the termination portions TR of the trench gates TG extending in the X direction. As an example, the body region 14 is configured in the following manner; an impurity is implanted as a single continuous region substantially throughout the entire surface of the element region 20, and the impurity of the source regions 15 is implanted in stripes extending in the Y direction perpendicularly to the first trenches 61, and thereby, the body region 14 adjacent to the source regions 15 is arranged between the source regions 15. In other words, the body region 14 has the ladder-shaped pattern in which ends of the stripe portion 14S extending in the Y direction are linked to the outer frame portion 14T in the shape of the frame, as seen in plan view. The outer frame portion 14T is arranged extending outwardly beyond the ends of the source region 15 and to the outside of the termination portions TR of the trench gates TG.

The stripe portions 14S of the body regions 14 and the source regions 15 are arranged adjacent to and alternating with each other, extending in the Y direction perpendicular to the extending direction of the first trenches 61. Sidewalls of the first trenches 61 along the X direction are adjacent alternately to the stripe portions 14S of the body regions 14 and the source regions 15. Sidewalls of the second trenches 62 are adjacent to the source regions 15.

Referring to FIG. 2B, the pair of the first trenches 61 (61a, 61b) have opening portions in opposite sidewalls, and end portions of the second trench 62 extending in the Y direction are linked to the opening portions. In other words, any of the second trenches 62 cross the first trench 61 in T-shape (or in the shape of a trifurcate road), rather than in the shape of a cross, in the crossing portion CR (circled in FIG. 2B).

Inner walls of the trenches 6 are coated with a gate insulating film 11. The gate insulating film 11 is an oxide film for example, and coats continuously the inner walls of the first trenches 61, the second trenches 62 and the third trenches 63. Incidentally, the gate insulating film 11 also is contained in the trench gates TG. Then, the trench gates TG are continuous in U-shape in the termination portions TR by the third trenches 63.

The body region 14 is arranged between the second trenches 62 without being adjacent to the second trenches 62, except in the vicinity of the termination portions TR of the trench gates TG. In the vicinity of the termination portions TR of the trench gates TG, the body region 14 is provided adjacent to the second trenches 62 in immediate proximity to the termination portions TR, and the body region 14 is arranged extending to the outside of the termination portions TR. In other words, one sidewall of the second trench 62 in immediate proximity to the termination portion TR is adjacent to the source region 15, while the other is adjacent to the body region 14 (or the outer frame portion 14T).

In the embodiment, the body region 14 has the ladder-shaped pattern as seen in plan view thereby to enable increasing the area of the body region 14 in the outer frame portion 14T, thus ensuring sufficiently the area of the body region 14 in the vicinity of an outer peripheral end portion of the element region 20, and hence contributing to an improvement in avalanche resistance.

Further, a region a indicated by hatching in FIG. 2A is defined by the two adjacent first trenches 61 and the two second trenches 62. For one region α, the body region 14 (or the stripe portions 14S) is in ohmic contact with the source electrode 17 at two points. Then, a distance W1 between the stripe portion 14S and the adjacent stripe portion 14S of the body region 14 is one to two times a distance W2 from the stripe portion 14S to the adjacent second trench 62. Thereby, an increase in potential in a channel layer 4 on the underside of the source region 15 is made uniform to achieve suppression of parasitic operation.

Incidentally, a configuration may be such that the body region 14 is formed in the ladder-shaped pattern (that is, impurity ion implantation occurs) by using a mask and the source region 15 is arranged in stripes between the body regions 14.

Figure 3A:
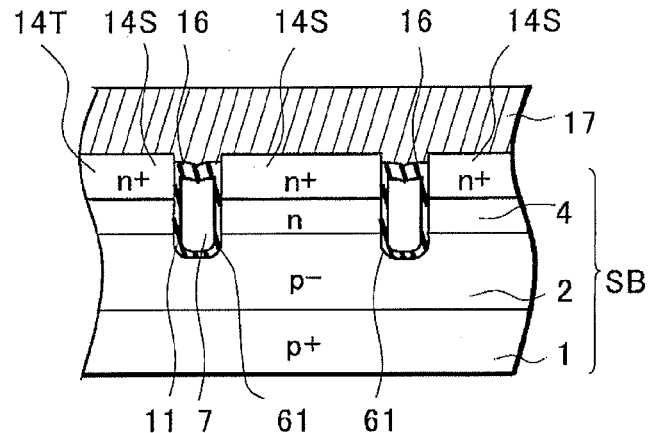
FIGS. 3A to 3C are cross-sectional views of assistance in explaining the insulated gate semiconductor device according to the embodiment of the present invention.
Figure 3B:
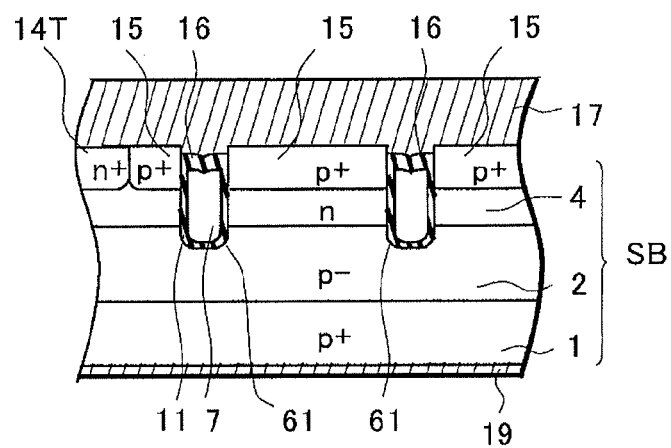
Figure 3C:
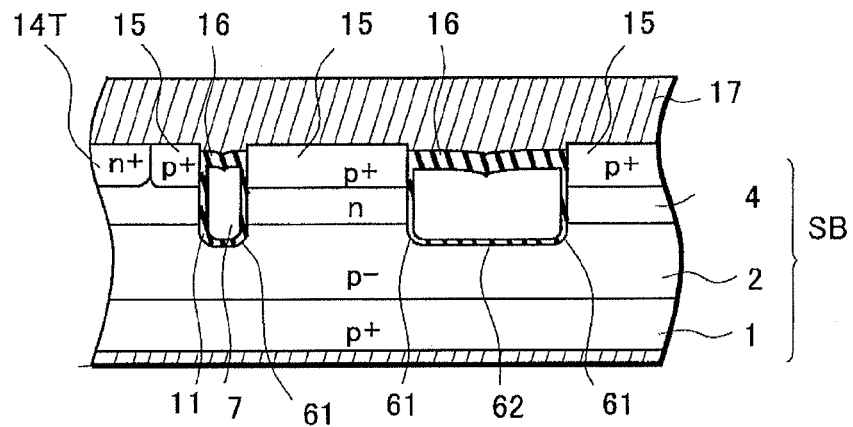

Description will be given with regard to a cross-sectional structure of the MOSFET 100 with reference to FIGS. 3A to 3C and FIGS. 4A to 4C. FIGS. 3A, 3B and 3C are cross-sectional views taken along lines a-a, b-b and c-c, respectively, of FIG. 2B, and FIGS. 4A, 4B and 4C are cross-sectional views taken along lines d-d, e-e and f-f, respectively, of FIG. 2B.

Referring to FIG. 3A, the substrate SB is constructed of the p⁻ type semiconductor layer 2 (for example, a p⁻ type silicon epitaxial layer) provided on top of a p⁺ type silicon semiconductor substrate 1. The channel layer 4 as a diffused region of an n type impurity (for example, phosphorus (P)) is provided on the surface of the p⁻ type semiconductor layer 2 as a drain region.

As seen in cross section taken along the line a-a, the trenches 6 are the first trenches 61 and reach through the channel layer 4 to the p⁻ type semiconductor layer 2. The gate insulating film 11 is provided on the inner walls of the first trenches 61. The gate insulating film 11 has a film thickness on the order of a few hundreds of angstroms according to driving voltage of the MOSFET 100. Also, the gate electrodes 7 are provided in the first trenches 61 by burying an electrically-conductive material in the first trenches 61. The electrically-conductive material is polycrystalline silicon for example, and a p type impurity (e.g. boron (B)), for example, is introduced into the polycrystalline silicon in order to achieve low resistance.

The body region 14 is provided on a surface of the channel layer 4 adjacent to the first trenches 61, and is the diffused region of an n⁺ type impurity (for example, phosphorus (P)) having a higher impurity concentration than that of the channel layer 4. As seen in cross section, the first trenches 61 are adjacent to the body region 14, and the body region 14 alone is arranged between the first trenches 61, while the source region 15 is not arranged between the first trenches 61.

Interlayer dielectrics 16 are buried on top of the gate electrodes 7 in the first trenches 61. The source electrode 17 subjected to patterning into a desired shape by sputtering aluminum (Al) or the like is provided on the surface of the substrate SB. The source electrode 17 is provided throughout the entire surface of the element region 20, coating the surface of the substrate SB substantially flat, and is in contact with the body region 14 as seen in cross section. Also, a drain electrode 19 (as shown in FIG. 3B) is provided on the underside of the substrate SB.

Referring to FIG. 3B, as seen in cross section taken along the line b-b, the first trenches 61 are adjacent to the source region 15, and the source region 15 alone is arranged on the surface of the channel layer 4 between the first trenches 61.

The source region 15 is a diffused region of a p⁺ type impurity (for example, boron (B)). Also, the source electrode 17 is in contact with the source region 15 as seen in cross section. Incidentally, for example when a manufacturing process includes implanting the impurity of the body region 14 substantially throughout the entire surface of the element region 20, and implanting the impurity of the source region 15 in stripes on top of the impurity of the body region 14, ion implantation takes place in the implant region of the impurity of the source region 15 under conditions such that the impurity of the body region 14 is canceled out by the impurity of the source region 15. Thereby, as shown in FIG. 3B, the formed depth of the source region 15 reaches that of the body region 14, and thus, the body region 14 is not arranged below the source region 15.

Referring to FIG. 3C, the first trenches 61 and the second trench 62 are provided as seen in cross section taken along the line c-c. Also, the source region 15 alone is arranged on the surface of the channel layer 4 adjacent to the first trenches 61, and the source region 15 is in contact with the source electrode 17.

Figure 4A:
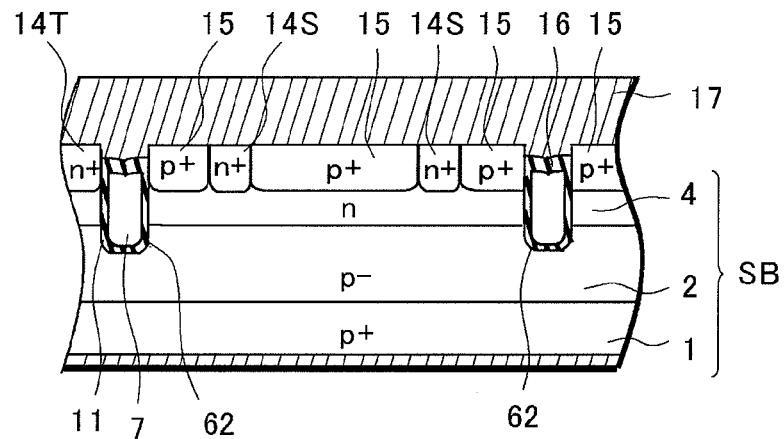
FIGS. 4A to 4C are cross-sectional views of assistance in explaining the insulated gate semiconductor device according to the embodiment of the present invention.

Referring to FIG. 4A, as seen in cross section taken along the line d-d, the second trenches 62 are arranged, and the source region 15 is arranged on the surface of the channel layer 4 adjacent to the second trenches 62. Also, the source regions 15 and the body regions 14 are arranged alternating with and adjacent to each other, between the adjacent second trenches 62. The source region 15 between the body regions 14 may not be adjacent to the first trenches 61, as is seen in cross section. The source electrode 17 is in contact with the source region 15 and the body region 14.

Also, the second trench 62 on the left-hand side of FIG. 4A is the second trench 62 in immediate proximity to the termination portion, and one sidewall of the second trench 62 is adjacent to the source region 15, while the other is adjacent to the body region 14.

Figure 4B:
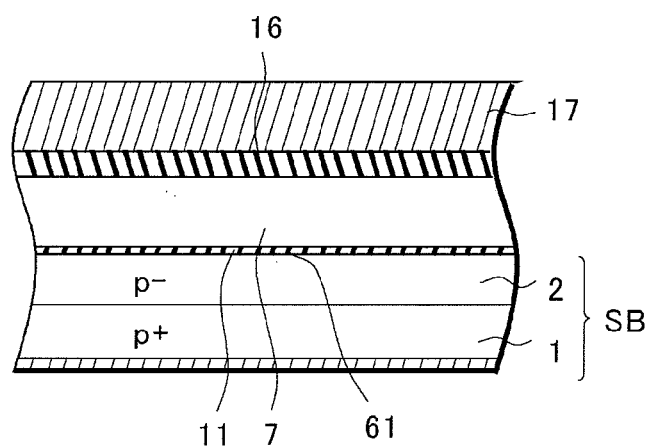

Referring to FIG. 4B, as seen in cross section taken along the line e-e, the first trench 61 alone is arranged, and the gate electrode 7 is insulated from the source electrode 17 by the interlayer dielectric 16 buried on top of the gate electrode 7 in the first trench 61.

Figure 4C:
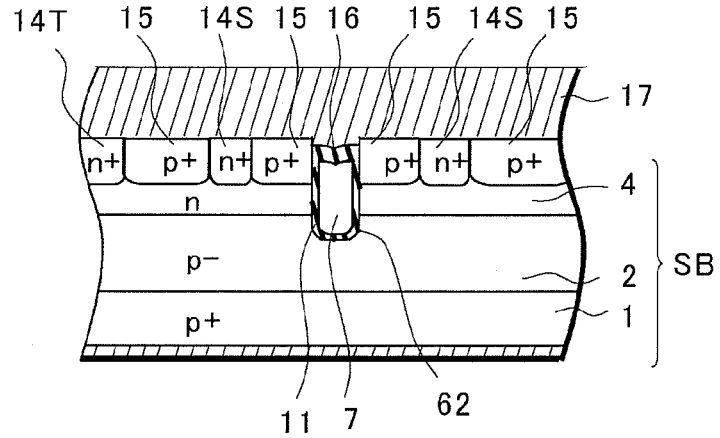

Referring to FIG. 4C, as seen in cross section taken along the line f-f, the second trench 62 is arranged, and the source region 15 is arranged on the surface of the channel layer 4 adjacent to the second trench 62. Also, the body regions 14 and the source regions 15 are arranged alternating with and adjacent to each other, on the surface of the channel layer 4, and the source electrode 17 is in contact with the source region 15 and the body region 14.

An example of a manufacturing method for obtaining such a structure is as follows. The trenches 6 are formed in the p⁻ type semiconductor layer 2, and polycrystalline silicon is buried in the trenches 6 to form the gate electrodes 7, and thereafter, the channel layer 4 is formed throughout the entire surface, and the n⁺ type impurity is ion implanted throughout the entire surface. After that, the p⁺ type impurity is ion implanted in plural regions in stripes spaced apart. Then, the n⁺ type impurity and the p⁺ type impurity are diffused to form the body region 14 in the shape of a ladder having the outer frame portion and the stripe portion, and the source region 15 adjacent to the stripe portion. After that, the interlayer dielectrics 16 are buried on top of the gate electrodes 7 in the trenches 6 to form the source electrode 17 coating the element region 20.

As described above, in the embodiment, a configuration is such that the first trenches 61 are formed in stripes, and the source regions 15 and the body regions 14 (or the stripe portions 14S) are arranged perpendicularly to the first trenches 61. When the first trenches 61 (or the trench gates TG) are in the form of stripes, transistor operation is possible, provided that the source regions 15 and the body regions 14 are formed in any region along the trench gates TG. Therefore, allowance can be made for accuracy of mask alignment for forming the source regions and the body regions, and thus, the pitch p1 of the first trenches 61 can be correspondingly reduced, as compared to the structure in which the trench gates are formed in the grid pattern.

Specifically, the pitch p1 can be reduced to about ⅓ as compared to the case of the grid pattern, which in turn enables contributing to a reduction in on-state resistance due to finer cells.

Further, the configuration is such that the interlayer dielectrics 16 are buried in the trenches 6, thereby achieving finer cells, as compared to the case where the interlayer dielectrics 16 are provided on the surface of the substrate SB.

In addition, in the embodiment, the second trenches 62 (or the trench gates TG) connecting to the first trenches 61 in T-shape are provided. Thereby, polycrystalline silicon in the trenches 6 in the crossing portions CR is deposited along three sidewalls, that is, a sidewall extending in a straight line, and two sidewalls bent substantially at right angles, as seen in plan view. In other words, the structure is such that, in the crossing portions CR, the polycrystalline silicon is filled into the trenches from three directions.

Therefore, the occurrence of voids in the polycrystalline silicon can be prevented, which in turn enables improvements in characteristics such as on-state resistance, threshold voltage (Vp), and forward voltage (Vf), as compared to the case of the trench gates in the form of stripes alone.

The second trenches 62 are arranged adjacent to the source regions 15, in the regions sandwiched in between the stripe portions 14S of the body regions 14. Also, the second trenches 62 are arranged alternating with each other, between the adjacent first trenches 61, so that the second trenches 62 are shifted from each other by one-half the pitch p2. Although the provision of the channel layer 4 in no contact with the body region 14 may possibly cause an increase in resistance and hence parasitic operation (i.e. latch-up), the pattern of the embodiment eliminates formation of the channel layer 4 in no contact with the body region 14 and thus enables suppression of the parasitic operation.

The provision of the second trench 62 enables increasing a gate length by the length of the second trench 62, as compared to the structure of the trench gates TG in the form of stripes alone. Specifically, the gate length can be increased by about 2.5%, and this also enables contributing to the reduction in the on-state resistance.

Further, the arrangement of the body region 14 (or the outer frame portion 14T) in the outer peripheral end portion of the element region 20 enables increasing the area of the body region 14 and thus improving the avalanche resistance, as compared to the structure in which the body regions are arranged in stripes alone.

In the above-described embodiment, description has been given by way of example with regard to an instance where the plural second trenches 62 are provided at the equal pitch p2 for each of the pairs of the adjacent first trenches 61, and the plural second trenches 62 are uniformly arranged on the element region 20; however, the present invention is not so limited. Specifically, for example, a configuration may be such that the second trenches 62 are arranged only in the vicinity of the termination portions TR of the first trenches 61, and this configuration enables increasing the gate length, as compared to the conventional structure constructed of the trenches in stripes alone. However, it is preferable that a somewhat large number of second trenches 62 crossing the first trenches 61 in T-shape be provided in order to reduce voids in polycrystalline silicon buried in the first trenches 61.

In the embodiment, description has been given above by way of example with regard to an instance where the p-channel type MOSFET 100 is arranged on the element region 20; however, the present invention may be applied to an n-channel type MOSFET of an opposite conductivity type, or an insulated gate semiconductor device for a protective circuit of a secondary battery in which two MOSFETs are arranged using a common drain for one chip, and the same advantageous effects can be achieved.

Also, although description has been given by way of example with regard to the MOSFET having the trench structure, the present invention may likewise be carried out in a planar structure in which the gate electrode 7 is provided on the substrate surface.

Further, the present invention may likewise be carried out in an n-channel type IGBT (Insulated Gate Bipolar Transistor) or a p-channel type IGBT of an opposite conductivity type, in which a p type semiconductor region is provided on an underlayer of the $n^+$ type silicon semiconductor substrate 1 shown in FIGS. 4A to 4C, and the same advantageous effects can be achieved.

According to the present invention, the following advantageous effects can be achieved.

Firstly, a trench gate (e.g. a second trench) crossing trench gates (e.g. first trenches) in stripes in T-shape (or in the shape of a trifurcate road) is provided thereby to achieve excellent burying of polycrystalline silicon in the trenches and thus enable suppression of the occurrence of voids and hence reductions in characteristic variations (e.g. on-state resistance variations, threshold voltage variations, and forward voltage variations).

Secondly, the second trench (or the trench gate) is added thereby to enable increasing a total gate length, as compared to the structure of the trench gates in the form of stripes alone. Specifically, the total gate length can be increased by about 2.5%, which in turn enables contributing to the reduction in the on-state resistance.

Thirdly, a body region has a ladder-shaped pattern formed of an outer frame portion and a stripe portion, as seen in plan view, thereby to enable increasing the area of the body region in an outer peripheral end portion of an element region and thus improving avalanche resistance.

Fourthly, a linkage portion of gate lead wiring is provided in a straight line, such as is not bent, along one side of a chip thereby to reduce the area of a peripheral region and thus achieve an increase in the area of the element region or chip size reduction.

Fifthly, any of the linkage portion of the gate lead wiring and a gate metal layer having a connection to the linkage portion can avoid formation of bent portions curved with small curvature in corner portions of the chip, thus achieving the increase in the area of the element region or the chip size reduction.

What is claimed is:

1. An insulated gate semiconductor device comprising:
a first semiconductor layer of a first general conductivity type;
a channel layer of a second general conductivity type disposed on the first semiconductor layer;
a plurality of first trenches extending in a first direction in the plan view of the semiconductor device, the first trenches penetrating through the channel layer and reaching the first semiconductor layer;
a plurality of second trenches extending in a second direction in the plan view, each of the second trenches connecting a corresponding pair of first trenches in the plan view;
a first insulating film provided on inner walls of the first trenches and the second trenches;
a gate electrode disposed in the first trenches and the second trenches;
a second insulating film covering the gate electrode;
a source region of the first general conductivity type formed in a surface portion of the channel layer, the source region extending in the second direction in the plan view; and
a body region of the second general conductivity type formed in a surface portion of the channel layer so as to be in contact with the source region and a corresponding first trench;
wherein two of the first trenches and two of the second trenches define a cell which makes transistor operation possible, and
the cell comprises two body regions of the second general conductivity type formed in a surface portion of the channel layer.

2. The insulated gate semiconductor device of claim 1, wherein the source region is adjacent the second trench in the plan view.

3. The insulated gate semiconductor device of claim 1, further comprising a third trench connecting a terminal portion of a first trench and a terminal portion of another first trench that is next to the first trench.

4. The insulated gate semiconductor device of claim 3, wherein the body region extends to surround the third trench in the plan view.

5. The insulated gate semiconductor device of claim 1, further comprising a gate lead wiring provided in a straight line along one side of the first semiconductor layer in the plan view.

6. The insulated gate semiconductor device of claim 5, further comprising a gate metal layer extending along and connected to the gate lead wiring.

7. The insulated gate semiconductor device of claim 1, wherein the second trenches are connected to corresponding first trenches so as to form a T-shape in the plan view.

8. An insulated gate semiconductor device comprising:
a first semiconductor layer of a first general conductivity type;
a channel layer of a second general conductivity type disposed on the first semiconductor layer;
a plurality of first trenches extending in a first direction in the plan view of the semiconductor device, the first trenches penetrating through the channel layer and reaching the first semiconductor layer;
a plurality of second trenches extending in a second direction in the plan view, each of the second trenches connecting a corresponding pair of first trenches in the plan view;
a first insulating film provided on inner walls of the first trenches and the second trenches;
a gate electrode disposed in the first trenches and the second trenches;
a second insulating film covering the gate electrode; and
a source region of the first general conductivity type formed in a surface portion of the channel layer, the source region extending in the second direction in the plan view,
wherein two of the first trenches and two of the second trenches define a cell which makes transistor operation possible, and
the cell comprises two body regions of the second general conductivity type formed in a surface portion of the channel layer.

9. The insulated gate semiconductor device of claim 8, wherein the source region is adjacent a corresponding second trench in the plan view.

10. The insulated gate semiconductor device of claim 8, further comprising a third trench connecting a terminal portion of a first trench and a terminal portion of another first trench that is next to the first trench.

11. The insulated gate semiconductor device of claim 8, wherein the body regions are in contact with the source region.

12. The insulated gate semiconductor device of claim 10, wherein the body regions extend to surround the third trench in the plan view.

13. The insulated gate semiconductor device of claim 8, further comprising a gate lead wiring provided in a straight line along one side of the first semiconductor layer in the plan view.

14. The insulated gate semiconductor device of claim 13, further comprising a gate metal layer extending along and connected to the gate lead wiring.

15. The insulated gate semiconductor device of claim 8, wherein the second trenches are connected to corresponding first trenches so as to form a T-shape in the plan view.

16. An insulated gate semiconductor device comprising:
 a first semiconductor layer of a first general conductivity type;
 a channel layer of a second general conductivity type disposed on the first semiconductor layer;
 a plurality of first trenches extending in a first direction in the plan view of the semiconductor device, the first trenches penetrating through the channel layer and reaching the first semiconductor layer;
 a plurality of second trenches extending in a second direction in the plan view, each of the second trenches connecting a corresponding pair of first trenches in the plan view;
 a first insulating film provided on inner walls of the first trenches and the second trenches;
 a gate electrode disposed in the first trenches and the second trenches;
 a second insulating film covering the gate electrode; and
 a source region of the first general conductivity type formed in a surface portion of the channel layer, the source region extending in the second direction in the plan view,
 wherein two of the first trenches and two of the second trenches define a cell which makes transistor operation possible, and
 the cell comprises two body regions of the second general conductivity type formed in a surface portion of the channel layer, wherein the body regions are in contact with the source region.

17. The insulated gate semiconductor device of claim 16, wherein the source region is adjacent a corresponding second trench in the plan view.

18. The insulated gate semiconductor device of claim 16, further comprising a third trench connecting a terminal portion of a first trench and a terminal portion of another first trench that is next to the first trench.

19. The insulated gate semiconductor device of claim 18, wherein the body regions extend to surround the third trench in the plan view.

20. The insulated gate semiconductor device of claim 16, further comprising a gate lead wiring provided in a straight line along one side of the first semiconductor layer in the plan view.

* * * * *